United States Patent
Hoshino

(10) Patent No.: US 11,988,964 B2
(45) Date of Patent: *May 21, 2024

(54) POSITIVE RESIST COMPOSITION FOR EUV LITHOGRAPHY AND METHOD OF FORMING RESIST PATTERN

(71) Applicant: ZEON CORPORATION, Tokyo (JP)

(72) Inventor: Manabu Hoshino, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 882 days.

This patent is subject to a terminal disclaimer.

(21) Appl. No.: 17/042,912

(22) PCT Filed: Apr. 17, 2019

(86) PCT No.: PCT/JP2019/016445
§ 371 (c)(1),
(2) Date: Sep. 29, 2020

(87) PCT Pub. No.: WO2019/208354
PCT Pub. Date: Oct. 31, 2019

(65) Prior Publication Data
US 2021/0026244 A1    Jan. 28, 2021

(30) Foreign Application Priority Data

Apr. 27, 2018 (JP) ................. 2018-086161

(51) Int. Cl.
| | |
|---|---|
| *G03F 7/039* | (2006.01) |
| *C08F 212/08* | (2006.01) |
| *C08F 220/24* | (2006.01) |
| *G03F 7/20* | (2006.01) |
| *G03F 7/32* | (2006.01) |

(52) U.S. Cl.
CPC .......... *G03F 7/0392* (2013.01); *C08F 212/08* (2013.01); *C08F 220/24* (2013.01); *G03F 7/2004* (2013.01); *G03F 7/32* (2013.01)

(58) Field of Classification Search
None
See application file for complete search history.

(56) References Cited

U.S. PATENT DOCUMENTS

| | | | | |
|---|---|---|---|---|
| 4,259,407 A * | 3/1981 | Tada | .............. | G03F 7/039 |
| | | | | 430/326 |
| 7,429,557 B2 * | 9/2008 | Grzyll | .............. | C11D 7/5018 |
| | | | | 510/408 |
| 9,541,830 B2 * | 1/2017 | Ober | .............. | G03F 7/038 |
| 9,835,949 B2 * | 12/2017 | Jesorka | .............. | G03F 7/325 |
| 2009/0029274 A1 * | 1/2009 | Olson | .............. | H01L 21/28079 |
| | | | | 510/407 |
| 2012/0129100 A1 | 5/2012 | Shibuya et al. | | |
| 2019/0004425 A1 | 1/2019 | Hoshino | | |
| 2019/0056664 A1 | 2/2019 | Hoshino | | |

FOREIGN PATENT DOCUMENTS

| | | |
|---|---|---|
| JP | H083636 B2 | 1/1996 |
| JP | 2013257379 A | 12/2013 |
| JP | 2018106060 A | 7/2018 |
| JP | 2018106065 A | 7/2018 |
| JP | 2019015860 A | 1/2019 |
| KR | 1020120056835 A | 6/2012 |
| TW | 201739773 A | 11/2017 |

(Continued)

OTHER PUBLICATIONS

Sigma-Aldrich, Safety Data Sheet: Nonafluorobutyl methyl ether (Year: 2022).*
Technical Data Sheet: Dupont Vertrel XF (Year: 2008).*
Jul. 2, 2019, International Search Report issued in the International Patent Application No. PCT/JP2019/016445.
Roberto Fallica et al., Lithographic performance of ZEP520A and mr-PosEBR resists exposed by electron beam and extreme ultraviolet lithography, Journal of Vacuum Science & Technology B, 2017, vol. 35, Issue 6.
Oct. 27, 2020, International Preliminary Report on Patentability issued in the International Patent Application No. PCT/JP2019/016445.

*Primary Examiner* — Sean M DeGuire
*Assistant Examiner* — Andrew Preston Traywick
(74) *Attorney, Agent, or Firm* — KENJA IP LAW PC

(57) ABSTRACT

Provided is a positive resist composition for EUV lithography that can form a resist film having high sensitivity to extreme ultraviolet light. The positive resist composition contains a solvent and a copolymer that includes a monomer unit (A) represented by general formula (I) and a monomer unit (B) represented by general formula (II). In the formulae, $R^1$ indicates an organic group including 5 or more fluorine atoms, le indicates a hydrogen atom, a fluorine atom, an unsubstituted alkyl group, or a fluorine atom-substituted alkyl group, $R^3$ indicates a hydrogen atom, an unsubstituted alkyl group, or a fluorine atom-substituted alkyl group, p and q are each an integer of 0 to 5, and p+q=5.

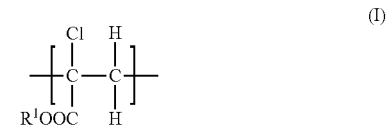

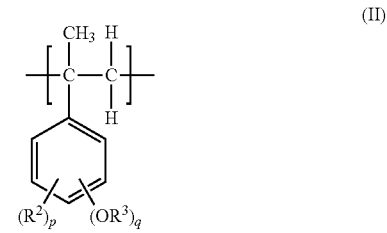

7 Claims, No Drawings

(56) References Cited

FOREIGN PATENT DOCUMENTS

WO 2017130872 A1 8/2017

\* cited by examiner

POSITIVE RESIST COMPOSITION FOR EUV LITHOGRAPHY AND METHOD OF FORMING RESIST PATTERN

TECHNICAL FIELD

The present disclosure relates to a positive resist composition for EUV (extreme ultraviolet) lithography and a method of forming a resist pattern using EUV.

BACKGROUND

Polymers that display increased solubility in a developer after undergoing main chain scission through irradiation with ionizing radiation, such as an electron beam, or short-wavelength light, such as ultraviolet light, are conventionally used as main chain scission-type positive resists in fields such as semiconductor production.

Specifically, Patent Literature (PTL) 1, for example, discloses a positive resist formed of an α-methylstyrene-methyl α-chloroacrylate copolymer as a main chain scission-type positive resist, whereas PTL 2, for example, discloses a positive resist formed of an α-methylstyrene-2,2,2-trifluoroethyl α-chloroacrylate copolymer as a main chain scission-type positive resist. In PTL 1 and 2, resist patterns are formed by irradiating resist films formed of these positive resists with electron beams.

Moreover, in recent years, EUV lithography using extreme ultraviolet light (EUV) has been attracting attention as a technique that enables formation of fine patterns and has a small proximity effect during exposure compared to when an electron beam or the like is used. Non-Patent Literature (NPL) 1, for example, evaluates patterning performance during exposure using extreme ultraviolet light for a resist film formed using a positive resist composition that contains an α-methylstyrene-methyl α-chloroacrylate copolymer.

CITATION LIST

Patent Literature

PTL 1: JP-H8-3636B
PTL 2: WO2017/130872A1

Non-Patent Literature

NPL 1: Roberto Fallica (and 6 others), "Lithographic performance of ZEP520A and mr-PosEBR resists exposed by electron beam and extreme ultraviolet lithography", Journal of Vacuum Science & Technology B, October 2017

SUMMARY

Technical Problem

However, resist films formed using the conventional positive resists described above have low sensitivity to extreme ultraviolet light and leave room for improvement in terms of enabling efficient formation of a resist pattern.

Accordingly, an object of the present disclosure is to provide a positive resist composition for EUV lithography that can form a resist film having high sensitivity to extreme ultraviolet light and to also provide a method that enables efficient formation of a resist pattern using extreme ultraviolet light.

Solution to Problem

The inventor conducted diligent studies with the aim of achieving the object set forth above. The inventor reached a new finding that a resist film formed using a positive resist composition that contains a specific copolymer including 5 or more fluorine atoms has high sensitivity to extreme ultraviolet light and that a resist pattern can be efficiently obtained by exposing the resist film using extreme ultraviolet light. In this manner, the inventor completed the present disclosure.

Specifically, the present disclosure aims to advantageously solve the problem set forth above, and a presently disclosed positive resist composition for EUV lithography comprises: a copolymer including a monomer unit (A) represented by general formula (I), shown below,

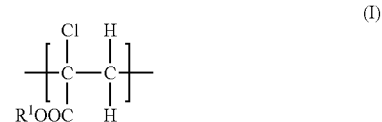

where, in general formula (I), $R^1$ is an organic group including 5 or more fluorine atoms, and a monomer unit (B) represented by general formula (II), shown below,

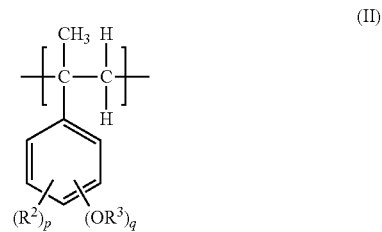

where, in general formula (II), $R^2$ is a hydrogen atom, a fluorine atom, an unsubstituted alkyl group, or a fluorine atom-substituted alkyl group, $R^3$ is a hydrogen atom, an unsubstituted alkyl group, or a fluorine atom-substituted alkyl group, p and q are each an integer of not less than 0 and not more than 5, and p+q=5; and a solvent.

Through inclusion of a copolymer including the specific monomer unit (A) and monomer unit (B) set forth above as a positive resist in this manner, it is possible to form a resist film having high sensitivity to extreme ultraviolet light.

Note that in a case in which p in general formula (II) is 2 or more, the plurality of $R^2$ groups may be the same or different. Moreover, in a case in which q in general formula (II) is 2 or more, the plurality of $R^3$ groups may be the same or different.

In the presently disclosed positive resist composition for EUV lithography, $R^1$ is preferably a fluoroalkyl group. When $R^1$ is a fluoroalkyl group, it is possible to form a resist film having further improved sensitivity to extreme ultraviolet light.

In the presently disclosed positive resist composition for EUV lithography, a total number of fluorine atoms included in the monomer unit (A) and the monomer unit (B) is preferably 5 or 6. When the total number of fluorine atoms included in the monomer unit (A) and the monomer unit (B) is 5 or 6, it is possible to form a resist film having further improved sensitivity to extreme ultraviolet light.

Moreover, the present disclosure aims to advantageously solve the problem set forth above, and a presently disclosed method of forming a resist pattern comprises: forming a resist film using any one of the positive resist compositions for EUV lithography set forth above; exposing the resist film using extreme ultraviolet light; developing the resist film that has been exposed; and rinsing the resist film that has been developed, wherein the rinsing is performed using a rinsing liquid having a surface tension of 20.0 mN/m or less.

By using extreme ultraviolet light to expose a resist film that has been formed using a positive resist composition for EUV lithography that contains a copolymer including the specific monomer unit (A) and monomer unit (B) set forth above in this manner, it is possible to efficiently form a resist pattern. Moreover, by performing the rinsing using a rinsing liquid that has a surface tension of 20.0 mN/m or less, the occurrence of collapse and the presence of residues in the formed resist pattern can be effectively inhibited.

Note that the "surface tension" of a rinsing liquid can be measured by the ring method at 25° C., for example.

In the presently disclosed method of forming a resist pattern, the rinsing liquid preferably has a solubility parameter of less than 6.8 $(cal/cm^3)^{1/2}$. The clarity of an obtained resist pattern can be increased by performing the rinsing using a rinsing liquid that has a solubility parameter of less than 6.8 $(cal/cm^3)^{1/2}$. Note that the "solubility parameter" (hereinafter, also referred to as the "SP value") of a rinsing liquid can be calculated by the group contribution method of Hoy.

In the presently disclosed method of forming a resist pattern, the developing is preferably performed using a developer having a surface tension of 17.0 mN/m or less. By using a developer having a surface tension of 17.0 mN/m or less to perform the developing, it is possible to cause good dissolution of a part having increased solubility in the developer as a result of exposure, and thus to increase the clarity of an obtained resist pattern.

Note that the "surface tension" of a developer can be measured by the ring method at 25° C., for example.

In the presently disclosed method of forming a resist pattern, the developer and the rinsing liquid preferably each comprise a different fluorine-containing solvent relative to one another. By using fluorine-containing solvents for the developer and the rinsing liquid, resist pattern collapse can be effectively inhibited, and the clarity of an obtained resist pattern can be improved.

Advantageous Effect

Through the presently disclosed positive resist composition for EUV lithography, it is possible to form a resist film having high sensitivity to extreme ultraviolet light.

Moreover, through the presently disclosed method of forming a resist pattern, it is possible to efficiently form a resist pattern using extreme ultraviolet light.

DETAILED DESCRIPTION

The following provides a detailed description of embodiments of the present disclosure.

The presently disclosed positive resist composition for EUV lithography is used for forming a resist film in formation of a resist pattern using extreme ultraviolet light, which enables formation of a fine pattern and has a small proximity effect during exposure compared to an electron beam or the like. The presently disclosed method of forming a resist pattern is a method of forming a resist pattern using the presently disclosed positive resist composition for EUV lithography and extreme ultraviolet light, and can suitably be adopted for formation of a resist pattern in a production process of a printed board such as a build-up board.

It should be noted that the presently disclosed positive resist composition for EUV lithography may be used in formation of a resist pattern by a method other than the presently disclosed method of forming a resist pattern. Specifically, the presently disclosed positive resist composition for EUV lithography may be used in a method of forming a resist pattern in which rinsing is performed using a rinsing liquid having a surface tension of less than 20.0 mN/m, or may be used in a method of forming a resist pattern in which rinsing of a resist film is not performed after development.

(Positive Resist Composition for EUV Lithography)

The positive resist composition for EUV lithography contains a solvent and a specific fluorine atom-containing copolymer (described in detail below), and may optionally further contain known additives that can be used in resist compositions.

—Copolymer—

The copolymer contained in the presently disclosed positive resist composition for EUV lithography includes:

a monomer unit (A) represented by general formula (I), shown below,

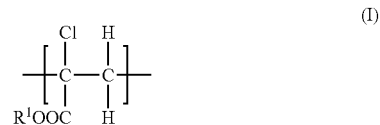

where, in general formula (I), $R^1$ is an organic group including 5 or more fluorine atoms; and a monomer unit (B) represented by general formula (II), shown below,

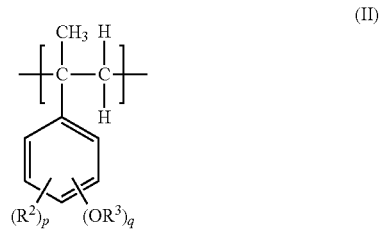

where, in general formula (II), $R^2$ is a hydrogen atom, a fluorine atom, an unsubstituted alkyl group, or a fluorine atom-substituted alkyl group, $R^3$ is a hydrogen atom, an unsubstituted alkyl group, or a fluorine atom-substituted alkyl group, p and q are each an integer of not less than 0 and not more than 5, and p+q=5.

Note that although the copolymer may also include any monomer units other than the monomer unit (A) and the monomer unit (B), the proportion constituted by the monomer unit (A) and the monomer unit (B) among all monomer units of the copolymer is, in total, preferably 90 mol % or more, and is preferably 100 mol % (i.e., the copolymer preferably only includes the monomer unit (A) and the monomer unit (B)). The total number of fluorine atoms included in the monomer unit (A) and the monomer unit (B) is preferably 5 or 6. This is because the sensitivity in a method of forming a resist pattern can be further increased due to further increased sensitivity of a resist film in a case in which the total number of fluorine atoms included in the monomer unit (A) and the monomer unit (B) is 5 or 6.

Although the copolymer may be a random copolymer, a block copolymer, an alternating copolymer (ABAB . . . ), or the like, for example, without any specific limitations so long as it includes the monomer unit (A) and the monomer unit (B), a copolymer including 90 mass % or more (upper limit of 100 mass %) of an alternating copolymer is preferable.

The copolymer undergoes main chain scission to lower molecular weight upon irradiation with extreme ultraviolet light as a result of including the specific monomer unit (A) and monomer unit (B). Moreover, the copolymer displays excellent sensitivity to extreme ultraviolet light when used as a resist as a result of at least the monomer unit (A) including 5 or more fluorine atoms. In particular, as a result of at least the monomer unit (A) including 5 or more fluorine atoms, the copolymer enables especially significant improvement of sensitivity in a case in which extreme ultraviolet light is used compared to sensitivity in a case in which the number of fluorine atoms in the monomer unit (A) is 4 or fewer and sensitivity in a case in which an electron beam or the like is used.

Note that although it is not clear why the copolymer can display excellent sensitivity to extreme ultraviolet light as a result of at least the monomer unit (A) including 5 or more fluorine atoms, it is presumed that absorption efficiency of extreme ultraviolet light is improved through the presence of fluorine atoms, thereby enabling rapid main chain scission.

Monomer Unit (A)

The monomer unit (A) is a structural unit that is derived from a monomer (a) represented by general formula (III), shown below.

(III)

(In general formula (III), 10 is the same as in general formula (I).)

The proportion constituted by the monomer unit (A) among all monomer units of the copolymer is not specifically limited but can, for example, be set as not less than 30 mol % and not more than 70 mol %.

$R^1$ in general formula (I) and general formula (III) is required to be an organic group including 5 or more fluorine atoms from a viewpoint of improving main chain scission properties of the copolymer upon irradiation with extreme ultraviolet light.

The number of fluorine atoms included in 10 in general formula (I) and general formula (III) is preferably 6 or more from a viewpoint of improving main chain scission properties of the copolymer upon irradiation with extreme ultraviolet light and further improving sensitivity in a case in which extreme ultraviolet light is used. Moreover, the number of fluorine atoms included in $R^1$ in general formula (I) and general formula (III) is preferably 7 or fewer from a viewpoint of improving the clarity of a resist pattern obtained when the copolymer is used as a positive resist.

The carbon number of $R^1$ is preferably not less than 2 and not more than 10, more preferably not less than 3 and not more than 4, and even more preferably 3. Solubility in a developer can be sufficiently improved when the carbon number is not less than any of the lower limits set forth above. Moreover, lowering of the glass-transition point can be inhibited and sufficient clarity of an obtained resist pattern can be ensured when the carbon number is not more than any of the upper limits set forth above.

More specifically, $R^1$ in general formula (I) and general formula (III) is preferably a fluoroalkyl group, a fluoroalkoxyalkyl group, or a fluoroalkoxyalkenyl group, and is more preferably a fluoroalkyl group. When $R^1$ is any of the groups set forth above, main chain scission properties of the copolymer upon irradiation with extreme ultraviolet light can be sufficiently improved.

The fluoroalkyl group is, for example, a 2,2,3,3,3-pentafluoropropyl group (number of fluorine atoms: 5; carbon number: 3), a 3,3,4,4,4-pentafluorobutyl group (number of fluorine atoms: 5; carbon number: 4), a 1H-1-(trifluoromethyl)trifluoroethyl group (number of fluorine atoms: 6; carbon number: 3), a 1H,1H,3H-hexafluorobutyl group (number of fluorine atoms: 6; carbon number: 4), a 2,2,3,3,4,4,4-heptafluorobutyl group (number of fluorine atoms: 7; carbon number: 4), or a 1,2,2,2-tetrafluoro-1-(trifluoromethyl)ethyl group (number of fluorine atoms: 7; carbon number: 3), of which, a 2,2,3,3,3-pentafluoropropyl group (number of fluorine atoms: 5; carbon number: 3) is preferable.

The fluoroalkoxyalkyl group is, for example, a pentafluoroethoxymethyl group or a pentafluoroethoxyethyl group.

The fluoroalkoxyalkenyl group is, for example, a pentafluoroethoxyvinyl group.

Examples of the monomer (a) represented by the previously described general formula (III) that can form the monomer unit (A) represented by the previously described general formula (I) include, but are not specifically limited to, fluoroalkyl esters of α-chloroacrylic acid such as 2,2,3,3,3-pentafluoropropyl α-chloroacrylate, 3,3,4,4,4-pentafluorobutyl α-chloroacrylate, 1H-1-(trifluoromethyl)trifluoroethyl α-chloroacrylate, 1H,1H,3H-hexafluorobutyl α-chloroacrylate, 1,2,2,2-tetrafluoro-1-(trifluoromethyl)ethyl α-chloroacrylate, and 2,2,3,3,4,4,4-heptafluorobutyl α-chloroacrylate; fluoroalkoxyalkyl esters of α-chloroacrylic acid such as pentafluoroethoxymethyl α-chloroacrylate and pentafluoroethoxyethyl α-chloroacrylate; and fluoroalkoxyalkenyl esters of α-chloroacrylic acid such as pentafluoroethoxyvinyl α-chloroacrylate.

Note that the monomer unit (A) is preferably a structural unit that is derived from a fluoroalkyl ester of α-chloroacrylic acid from a viewpoint of further improving main chain scission properties of the copolymer upon irradiation with extreme ultraviolet light. Furthermore, among structural units derived from fluoroalkyl esters of α-chloroacrylic acid, a structural unit that is derived from 2,2,3,3,3-pentafluoropropyl α-chloroacrylate is more preferable as the monomer unit (A). When the monomer unit (A) is a structural unit that is derived from 2,2,3,3,3-pentafluoropropyl α-chloroacrylate, the sensitivity of a resist film to extreme ultraviolet light can be especially increased.

Monomer Unit (B)

The monomer unit (B) is a structural unit that is derived from a monomer (b) represented by general formula (IV), shown below.

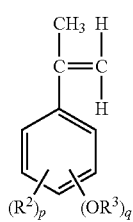

(IV)

(In general formula (IV), $R^2$, $R^3$, p, and q are the same as in general formula (II).)

The proportion constituted by the monomer unit (B) among all monomer units of the copolymer is not specifically limited but can, for example, be set as not less than 30 mol % and not more than 70 mol %.

Examples of fluorine atom-substituted alkyl groups that can constitute $R^2$ or $R^3$ in general formula (II) and general formula (IV) include, but are not specifically limited to, groups having a structure in which all or some of the hydrogen atoms of an alkyl group are replaced by fluorine atoms.

Examples of unsubstituted alkyl groups that can constitute $R^2$ or $R^3$ in general formula (II) and general formula (IV) include, but are not specifically limited to, unsubstituted alkyl groups having a carbon number of not less than 1 and not more than 5. Of such alkyl groups, a methyl group or an ethyl group is preferable as an unsubstituted alkyl group that can constitute $R^2$ or $R^3$.

From a viewpoint of improving the ease of production of the copolymer, the plurality of $R^2$ and/or $R^3$ groups that are present in general formula (II) and general formula (IV) are each preferably a hydrogen atom or an unsubstituted alkyl group, more preferably a hydrogen atom or an unsubstituted alkyl group having a carbon number of not less than 1 and not more than 5, and even more preferably a hydrogen atom.

Note that in general formula (II) and general formula (IV), from a viewpoint of improving the ease of production of the copolymer, it is preferable that p is 5, q is 0, and the five $R^2$ groups are each a hydrogen atom or an unsubstituted alkyl group, more preferable that the five $R^2$ groups are each a hydrogen atom or an unsubstituted alkyl group having a carbon number of not less than 1 and not more than 5, and even more preferable that the five $R^2$ groups are each a hydrogen atom.

On the other hand, from a viewpoint of further increasing the sensitivity of a resist film to extreme ultraviolet light, the plurality of $R^2$ and/or $R^3$ groups that are present in general formula (II) and general formula (IV) preferably include a fluorine atom or a fluorine atom-substituted alkyl group, and more preferably include a fluorine atom or a fluorine atom-substituted alkyl group having a carbon number of not less than 1 and not more than 5.

In particular, from a viewpoint of ensuring ease of production of the copolymer while also further increasing the sensitivity of a resist film to extreme ultraviolet light, it is preferable that, in general formula (II) and general formula (IV), p is 5, q is 0, and the five $R^2$ groups include a fluorine atom or a fluorine atom-substituted alkyl group, more preferable that one of the five $R^2$ groups is a fluorine atom or a fluorine atom-substituted alkyl group and the remaining four $R^2$ groups are hydrogen atoms, and even more preferable that one of the five $R^2$ groups is a fluorine atom and the remaining four $R^2$ groups are hydrogen atoms.

Examples of the monomer (b) represented by the previously described general formula (IV) that can form the monomer unit (B) represented by the previously described general formula (II) include, but are not specifically limited to, α-methylstyrene (AMS) and derivatives thereof such as (b-1) to (b-11), shown below. Of these examples, α-methylstyrene and 4-fluoro-α-methylstyrene, which is in accordance with general formula (b-2), are preferable as the monomer (b).

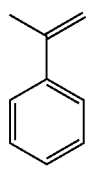

(b-1)

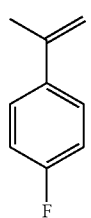

(b-2)

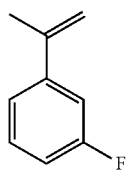

(b-3)

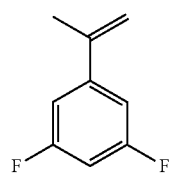

(b-4)

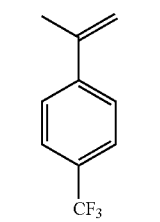

(b-5)

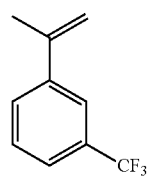

(b-6)

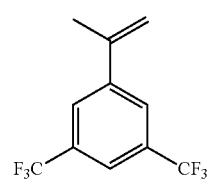

(b-7)

-continued

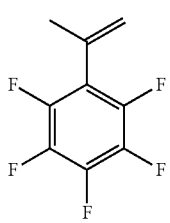
(b-8)

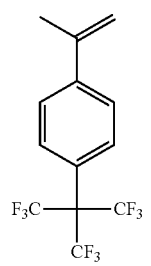
(b-9)

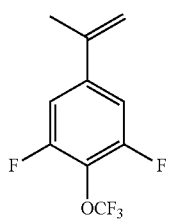
(b-10)

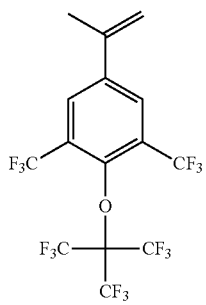
(b-11)

Weight-Average Molecular Weight

The weight-average molecular weight (Mw) of the copolymer can be set as not less than 20,000 and not more than 150,000. Moreover, the weight-average molecular weight (Mw) of the copolymer is preferably 100,000 or less, and more preferably 60,000 or less, and is preferably 30,000 or more. When the weight-average molecular weight (Mw) of the copolymer is not less than any of the lower limits set forth above, the elasticity of a positive resist formed using the copolymer can be improved, and thus resist pattern collapse can be inhibited. Moreover, when the weight-average molecular weight (Mw) of the copolymer is not more than any of the upper limits set forth above, sensitivity can be improved in a method of forming a resist pattern using a positive resist composition for EUV lithography that contains the copolymer.

Note that the "weight-average molecular weight (Mw)" can be measured by gel permeation chromatography.

Number-Average Molecular Weight

The number-average molecular weight (Mn) of the copolymer can be set as not less than 10,000 and not more than 100,000, for example. Moreover, the number-average molecular weight (Mn) of the copolymer is preferably 80,000 or less, and more preferably 40,000 or less. When the number-average molecular weight (Mn) of the copolymer is not more than any of the upper limits set forth above, sensitivity can be suitably improved in a method of forming a resist pattern using a positive resist composition for EUV lithography that contains the copolymer.

Note that the "number-average molecular weight (Mn)" can be measured by gel permeation chromatography in the same way as for the aforementioned "weight-average molecular weight (Mw)".

Molecular Weight Distribution

The molecular weight distribution (Mw/Mn) of the copolymer can be set as not less than 1.20 and not more than 2.50, for example. Moreover, the molecular weight distribution (Mw/Mn) of the copolymer is preferably 1.25 or more, and is preferably 2.00 or less, and more preferably 1.40 or less. When the molecular weight distribution (Mw/Mn) of the copolymer is not less than any of the lower limits set forth above, the ease of production of the copolymer can be increased. Moreover, when the molecular weight distribution (Mw/Mn) of the copolymer is not more than any of the upper limits set forth above, the clarity of an obtained resist pattern can be increased.

Note that the "molecular weight distribution (Mw/Mn)" is the ratio of the weight-average molecular weight (Mw) relative to the number-average molecular weight (Mn).

Production Method of Copolymer

The copolymer including the monomer unit (A) and the monomer unit (B) set forth above can be produced, for example, by carrying out polymerization of a monomer composition that contains the monomer (a) and the monomer (b), and then optionally purifying the obtained polymerized product.

The composition, molecular weight distribution, weight-average molecular weight, and number-average molecular weight of the copolymer can be adjusted by altering the polymerization conditions and the purification conditions. In one specific example, the composition of the copolymer can be adjusted by altering the proportion in which each monomer is contained in the monomer composition used in polymerization. In another example, the weight-average molecular weight and the number-average molecular weight can be reduced by raising the polymerization temperature. In yet another example, the weight-average molecular weight and the number-average molecular weight can be reduced by shortening the polymerization time.

The monomer composition used in production of the copolymer may be a mixture containing a monomer component that includes the monomer (a) and the monomer (b), an optionally useable solvent, a polymerization initiator, and optionally added additives. Polymerization of the monomer composition may be carried out by a known method. In particular, in a case in which a solvent is used, it is preferable that cyclopentanone or the like is used as the solvent. Moreover, it is preferable that a radical polymerization initiator such as azobisisobutyronitrile is used as the polymerization initiator.

A polymerized product obtained through polymerization of the monomer composition may be used as the copolymer as obtained or may, without any specific limitations, be collected by adding a good solvent such as tetrahydrofuran to a solution containing the polymerized product and subsequently dripping the solution to which the good solvent has been added into a poor solvent such as methanol to coagulate the polymerized product, and then the polymerized product may be purified as described below.

The method of purification in a case in which the obtained polymerized product is purified may be, but is not specifically limited to, a known purification method such as reprecipitation or column chromatography. Of these purification methods, purification by reprecipitation is preferable.

Note that purification of the polymerized product may be performed repeatedly.

Purification of the polymerized product by reprecipitation is, for example, preferably carried out by dissolving the resultant polymerized product in a good solvent such as tetrahydrofuran, and subsequently dripping the resultant solution into a mixed solvent of a good solvent, such as tetrahydrofuran, and a poor solvent, such as methanol, to cause precipitation of a portion of the polymerized product. When purification of the polymerized product is carried out by dripping a solution of the polymerized product into a mixed solvent of a good solvent and a poor solvent as described above, the molecular weight distribution, weight-average molecular weight, and number-average molecular weight of the resultant copolymer can easily be adjusted by altering the types and/or mixing ratio of the good solvent and the poor solvent. In one specific example, the molecular weight of copolymer that precipitates in the mixed solvent can be increased by increasing the proportion of the good solvent in the mixed solvent.

Also note that in a situation in which the polymerized product is purified by reprecipitation, polymerized product that precipitates in the mixed solvent of the good solvent and the poor solvent may be used as the presently disclosed copolymer, or polymerized product that does not precipitate in the mixed solvent (i.e., polymerized product dissolved in the mixed solvent) may be used as the presently disclosed copolymer. Polymerized product that does not precipitate in the mixed solvent can be collected from the mixed solvent by a known technique such as concentration to dryness.

—Solvent—

The solvent may be any known solvent so long as it is a solvent in which the copolymer set forth above is soluble. Of such solvents, a pentyl ester of an organic acid, a hexyl ester of an organic acid, or a mixture thereof is preferable as the solvent from a viewpoint of obtaining a positive resist composition having appropriate viscosity and improving coatability of the positive resist composition for EUV lithography, with pentyl acetate, hexyl acetate, or a mixture thereof being more preferable, and isoamyl acetate (isopentyl acetate) being even more preferable.

(Method of Forming Resist Pattern)

The presently disclosed method of forming a resist pattern uses the presently disclosed positive resist composition for EUV lithography set forth above and extreme ultraviolet light. More specifically, the presently disclosed method of forming a resist pattern includes: a step of forming a resist film using the above-described positive resist composition for EUV lithography containing the specific fluorine atom-containing copolymer (resist film formation step); a step of exposing the resist film using extreme ultraviolet light (exposure step); a step of developing the resist film that has been exposed (development step); and a step of rinsing the resist film that has been developed (rinsing step). A feature of the presently disclosed method of forming a resist pattern is that the rinsing step is performed using a rinsing liquid having a surface tension of 20.0 mN/m or less.

As a result of a resist film containing the specific fluorine atom-containing copolymer being developed and subsequently rinsed using a rinsing liquid having a surface tension of 20.0 mN/m or less in the presently disclosed method of forming a resist pattern, resist pattern collapse can be sufficiently inhibited while also favorably inhibiting the presence of residues in the resist pattern. Moreover, as a result of a resist film formed using the presently disclosed positive resist composition for EUV lithography set forth above being exposed using extreme ultraviolet light in the presently disclosed method of forming a resist pattern, a resist pattern can be efficiently formed.

<Resist Film Formation Step>

In the resist film formation step, the positive resist composition for EUV lithography set forth above is applied onto a workpiece, such as a substrate, that is to be processed using a resist pattern, and the applied positive resist composition for EUV lithography is dried to form a resist film. The substrate is not specifically limited and may, for example, be a mask blank including a light shielding layer on a substrate or a substrate including an electrically insulating layer and copper foil on the electrically insulating layer that is used in production of a printed board or the like.

Moreover, no specific limitations are placed on the application method and the drying method of the positive resist composition for EUV lithography, and any method that is typically used in formation of a resist film can be adopted.

Note that from a viewpoint of further improving sensitivity to extreme ultraviolet light, the density of the resist film formed in the resist film formation step is preferably 1.35 g/cm$^3$ or more, and more preferably 1.40 g/cm$^3$ or more. The density of the resist film can be adjusted by altering the composition of the copolymer and the formation conditions of the resist film.

<Exposure Step>

In the exposure step, the resist film that has been formed in the resist film formation step is irradiated with extreme ultraviolet light to write a desired pattern.

Although no specific limitations are placed on the wavelength of extreme ultraviolet light used for irradiation, the wavelength can be set as not less than 1 nm and not more than 30 nm, for example, and can be preferably set as 13.5 nm.

Moreover, exposure with extreme ultraviolet light can be performed using a known exposure tool such as an EQ-10M (produced by Energetiq Technology, Inc.) or NXE (produced by ASML).

<Development Step>

In the development step, the resist film that has been exposed in the exposure step and a developer are brought into contact to develop the resist film and form a resist pattern on the workpiece.

The method by which the resist film and the developer are brought into contact may be, but is not specifically limited to, a method using a known technique such as immersion of the resist film in the developer or application of the developer onto the resist film.

The developer used in the presently disclosed method of forming a resist pattern can, without any specific limitations, be any solvent that can dissolve a part of the resist film where main chain scission has occurred. Of such solvents, a solvent having a surface tension of 17.0 mN/m or less is preferably used as the developer. The surface tension of the developer is preferably 16.5 mN/m or less, and more preferably 15.0 mN/m or less. When the developer has a surface tension of 17.0 mN/m or less, the developer readily enters into fine gaps even when the development target is a fine resist pattern. Note that the surface tension of the developer can, for example, be 10.0 mN/m or more.

Moreover, it is preferable that a fluorine-containing solvent is used as the developer. Examples of fluorine-containing solvents that can be used include $CF_3CFHCFHCF_2CF_3$ (surface tension: 14.1 mN/m; SP value: 6.8 $(cal/cm^3)^{1/2}$), $CF_3CF_2CHCl_2$ (surface tension: 16.2 mN/m; SP value: 6.9

(cal/cm$^3$)$^{1/2}$), and C$_8$F$_{18}$ is (surface tension: 13.6 mN/m). Although one of these solvents may be used individually or two or more of these solvents may be used as a mixture, it is preferable that one solvent is used individually as the developer from a viewpoint of ease of collection, re-use, etc. Also note that although a liquid obtained by mixing a fluorine-containing solvent with another solvent may be used as the developer, from a viewpoint of increasing solubility of the resist film and further improving the sensitivity in the method of forming a resist pattern, it is preferable that the developer contains 95 volume % or more of a fluorine-containing solvent, more preferable that the developer contains 99 volume % or more of a fluorine-containing solvent, and preferable that the developer is substantially composed of only a fluorine-containing solvent. The phrase "substantially composed of only a fluorine-containing solvent" is a concept that can be inclusive of both a case in which the proportion constituted by a fluorine-containing solvent in the developer is 100 volume % and a case in which the developer contains an additive or the like in a trace amount of less than 0.1 volume %, for example, but is mainly composed of a fluorine-containing solvent. Note that since fluorine-containing solvents generally have high volatility, when a fluorine-containing solvent has been used in a conventional technique, the fluorine-containing solvent has typically been removed through drying by blowing or the like to obtain a resist pattern, without performing rinsing of the resist film that has been developed by the developer.

Furthermore, the developer preferably has a solubility parameter (SP value) of more than 6.5 (cal/cm$^3$)$^{1/2}$ and not more than 10.0 (cal/cm$^3$)$^{1/2}$ from a viewpoint of increasing the solubility of a part of the resist film where main chain scission has occurred.

The temperature of the developer is not specifically limited and can be set as not lower than 21° C. and not higher than 25° C., for example. Moreover, the development time can be set as not less than 30 seconds and not more than 4 minutes, for example.

<Rinsing Step>

In the rinsing step, the resist film that has been developed in the development step and a rinsing liquid having a surface tension of 20.0 mN/m or less are brought into contact to rinse the developed resist film. In the presently disclosed method, resist residues that are attached to the developed resist film can be effectively removed as a result of a rinsing step being performed using a rinsing liquid having the specific property set forth above after the development step. Therefore, the presently disclosed method of forming a resist pattern makes it possible to effectively inhibit the presence of residues in an obtained resist pattern and to form a clear resist pattern.

The method by which the developed resist film and the rinsing liquid are brought into contact may be, but is not specifically limited to, a method using a known technique such as immersing the resist film in the rinsing liquid or applying the rinsing liquid onto the resist film.

[Rinsing Liquid]

The rinsing liquid used in the presently disclosed method of forming a resist pattern is required to have a surface tension of 20.0 mN/m or less. Moreover, from a viewpoint of even more effectively inhibiting the presence of residues in an obtained resist pattern, the surface tension of the rinsing liquid is preferably 18.0 mN/m or less, and more preferably 14.5 mN/m or less, and is preferably 10.0 mN/m or more, and more preferably 12.5 mN/m or more. Furthermore, from a viewpoint of even more effectively inhibiting resist pattern collapse and further improving the clarity of an obtained resist pattern, the rinsing liquid preferably comprises a fluorine-containing solvent that is different to the previously described developer.

The rinsing liquid preferably contains a compound represented by general formula (α), shown below.

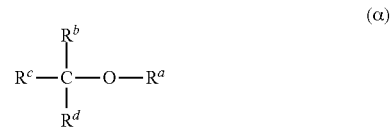

(α)

(In general formula (α), R$^a$ is an unsubstituted alkyl group, R$^b$ to R$^d$ are each a fluorine atom or a fluorine atom-substituted alkyl group, and at least one of R$^a$ to R$^d$ includes a fluorine atom.) Note that the compound represented by general formula (α) is a fluorine-containing compound, and a solvent that comprises this fluorine-containing compound is a fluorine-containing solvent.

Examples of unsubstituted alkyl groups that can constitute R$^a$ in general formula (a) include unsubstituted alkyl groups having a carbon number of not less than 1 and not more than 5, of which, a methyl group or an ethyl group is preferable.

Moreover, the fluorine atom-substituted alkyl group that can constitute any of R$^b$ to R$^d$ in general formula (α) is preferably a fluorine atom-substituted alkyl group having a carbon number of not less than 1 and not more than 5, and more preferably a 1,1,2,2,3,3,3-heptafluoropropyl group or a 1,1,2,2,2-pentafluoroethyl group.

Although the rinsing liquid can contain one compound represented by general formula (α) or can contain a plurality of compounds represented by general formula (α), it is preferable that the rinsing liquid contains only one compound represented by general formula (α) from a viewpoint of ease of collection and re-use of the rinsing liquid. Note that it is preferable that the rinsing liquid does not substantially contain, in addition to a compound represented by general formula (α), any of the compounds previously described as the "developer" or any other solvent that can typically be used in a pattern formation method using a main chain scission-type positive resist composition. The phrase "does not substantially contain" refers to an extremely low ratio relative to the overall rinsing liquid, such as less than 0.1 volume %.

In particular, preferable examples of compounds that can be represented by general formula (α) and can be contained in the rinsing liquid include methyl nonafluorobutyl ether (surface tension: 13.6 mN/m; SP value: 6.5 (cal/cm$^3$)$^{1/2}$; freezing point: −135° C.; boiling point: 61° C.) represented by general formula (α-1), shown below, ethyl nonafluorobutyl ether (surface tension: 13.6 mN/m; SP value: 6.3 (cal/cm$^3$)$^{1/2}$; freezing point: −138° C.; boiling point: 76° C.) represented by general formula (α-2), shown below, and 1,1,1,2,2,3,4,5,5,5-decafluoro-3-methoxy-4-(trifluoromethyl)pentane (surface tension: 15.0 mN/m; SP value: 6.2 (cal/cm$^3$)$^{1/2}$; freezing point (pour point): −38° C.; boiling point: 98° C.) represented by general formula (α-3), shown below, with methyl nonafluorobutyl ether represented by general formula (α-1) and ethyl nonafluorobutyl ether represented by general formula (α-2) being more preferable from a viewpoint of even more effectively inhibiting the presence of residues in an obtained resist pattern.

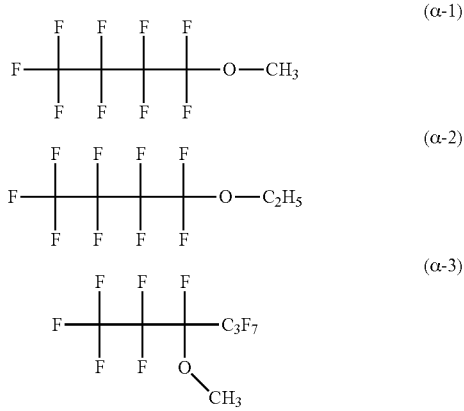

The solubility parameter (SP value) of the rinsing liquid is preferably 11.0 (cal/cm$^3$)$^{1/2}$ or less, more preferably less than 6.8 (cal/cm$^3$)$^{1/2}$, and even more preferably 6.5 (cal/cm$^3$)$^{1/2}$ or less from a viewpoint of even more effectively inhibiting the presence of residues in an obtained resist pattern. Note that the SP value of the rinsing liquid can, for example, be 2.0 (cal/cm$^3$)$^{1/2}$ or more. The freezing point of the rinsing liquid is preferably −30° C. or lower, and may be −100° C. or lower. The boiling point of the rinsing liquid is preferably 100° C. or lower, and more preferably 80° C. or lower. Note that the "freezing point" and the "boiling point" of the rinsing liquid are values at 1 atm (absolute pressure).

The temperature of the rinsing liquid is not specifically limited and can be set as not lower than 21° C. and not higher than 25° C., for example. Moreover, the rinsing time can be set as not less than 5 seconds and not more than 3 minutes, for example.

EXAMPLES

The following provides a more specific description of the present disclosure based on examples. However, the present disclosure is not limited to the following examples. In the following description, "%" and "parts" used in expressing quantities are by mass, unless otherwise specified.

In the examples and comparative examples, the following methods were used to measure and evaluate the weight-average molecular weight, number-average molecular weight, and molecular weight distribution of a copolymer, and the density and sensitivity to extreme ultraviolet light of a resist film. Note that the SP value of a developer and the SP value of a rinsing liquid were calculated by the group contribution method of Hoy. Moreover, the surface tension of a developer and the surface tension of a rinsing liquid were measured by the ring method at 25° C.

<Weight-Average Molecular Weight, Number-Average Molecular Weight, and Molecular Weight Distribution>

The weight-average molecular weight (Mw) and the number-average molecular weight (Mn) of a copolymer obtained in each example or comparative example were measured by gel permeation chromatography, and then the molecular weight distribution (Mw/Mn) of the copolymer was calculated. Specifically, the weight-average molecular weight (Mw) and the number-average molecular weight (Mn) of the copolymer were determined as values in terms of standard polystyrene using a gel permeation chromatograph (HLC-8220 produced by Tosoh Corporation) with tetrahydrofuran as an eluent solvent. The molecular weight distribution (Mw/Mn) was then calculated.

<Density>

The density of a resist film for density measurement was calculated by X-ray reflectivity using an automated multi-purpose X-ray diffractometer (SmartLab produced by Rigaku Corporation).

<Sensitivity>

An obtained sensitivity curve (horizontal axis: common logarithm of total irradiation dose of extreme ultraviolet light; vertical axis: remaining film fraction of resist film (0 remaining film fraction 1.00)) was fitted to a quadratic function in a range from a remaining film fraction of 0.20 to a remaining film fraction of 0.80, and a straight line that joined points on the obtained quadratic function (function of remaining film fraction and common logarithm of total irradiation dose) corresponding to remaining film fractions of 0 and 0.50 (linear approximation for gradient of sensitivity curve) was prepared. Thereafter, the total irradiation dose Eth (mJ/cm$^2$) of extreme ultraviolet light was determined for when the remaining film fraction on the prepared straight line (linear approximation for gradient of sensitivity curve) was 0. A smaller value for Eth indicates higher sensitivity of the resist film to extreme ultraviolet light and higher resist pattern formation efficiency.

EXAMPLE 1

<Production of Copolymer>

A monomer composition containing 3.0 g of 2,2,3,3,3-pentafluoropropyl α-chloroacrylate (ACAPFP) as monomer (a), 3.235 g of 4-fluoro-α-methylstyrene as monomer (b), and 0.00521 g of azobisisobutyronitrile as a polymerization initiator was loaded into a glass container. The glass container was tightly sealed and purged with nitrogen, and was then stirred for 6 hours in a 78° C. thermostatic tank under a nitrogen atmosphere. Thereafter, the glass container was restored to room temperature, the inside of the glass container was opened to the atmosphere, and then 10 g of tetrahydrofuran (THF) was added to the resultant solution. The solution to which the THF had been added was then dripped into 300 g of methanol to cause precipitation of a polymerized product. Thereafter, the solution containing the polymerized product that had precipitated was filtered using a Kiriyama funnel to obtain a white coagulated material (polymerized product). The obtained polymerized product had a weight-average molecular weight (Mw) of 38,837, a number-average molecular weight (Mn) of 22,658, and a molecular weight distribution (Mw/Mn) of 1.714. Moreover, the obtained polymerized product comprised 50 mol % of 2,2,3,3,3-pentafluoropropyl α-chloroacrylate units and 50 mol % of 4-fluoro-α-methylstyrene units.

[Purification of Polymerized Product]

Next, the obtained polymerized product was dissolved in 100 g of THF, and the resultant solution was dripped into a mixed solvent of 50 g of THF and 950 g of methanol (MeOH) to cause precipitation of a white coagulated material (copolymer comprising 4-fluoro-α-methylstyrene units and 2,2,3,3,3-pentafluoropropyl α-chloroacrylate units). Thereafter, the solution containing the copolymer that had precipitated was filtered using a Kiriyama funnel to obtain a white copolymer. The weight-average molecular weight, number-average molecular weight, and molecular weight distribution of the obtained copolymer were measured. The results are shown in Table 1.

<Production of Positive Resist Composition>

The obtained copolymer was dissolved in isoamyl acetate as a solvent to produce a resist solution (positive resist composition for EUV lithography) in which the concentration of the copolymer was 2 mass %.

<Formation of Resist Film>

A spin coater (MS-A150 produced by Mikasa Co., Ltd.) was used to apply the positive resist composition onto a silicon wafer of 4 inches in diameter such as to have a thickness of 70 nm. The applied positive resist composition was heated for 3 minutes by a hot-plate at a temperature of 180° C. to form a resist film (for sensitivity curve preparation) on the silicon wafer.

A resist film for density measurement was formed in the same manner as described above with the exception that the positive resist composition was applied such as to have a thickness of 50 nm. The density of the positive resist film formed of the copolymer was measured. The result is shown in Table 1.

<Exposure, Development, and Rinsing>

An EUV exposure tool (EQ-10M produced by Energetiq Technology, Inc.) was used to write a plurality of patterns (dimensions: 10 mm×10 mm) over the resist film with different extreme ultraviolet light irradiation doses, and development treatment was carried out for 1 minute at a temperature of 23° C. using a fluorine-containing solvent (produced by Du Pont-Mitsui Fluorochemicals Co., Ltd.; Vertrel XF® (Vertrel XF is a registered trademark in Japan, other countries, or both); $CF_3CFHCFHCF_2CF_3$) having a surface tension of 14.1 mN/m as a resist developer. Thereafter, 10 seconds of rinsing was performed using a fluorine-containing solvent (produced by 3M; Novec® 7100 (Novec is a registered trademark in Japan, other countries, or both); methyl nonafluorobutyl ether; freezing point: −135° C.; boiling point: 61° C.) having a surface tension of 13.6 mN/m as a rinsing liquid.

Note that the extreme ultraviolet light irradiation dose was varied in a range of 0 $mJ/cm^2$ to 20 $mJ/cm^2$ in increments of 2 $mJ/cm^2$.

Next, an optical film thickness measurement tool (Lambda Ace VM-1200 produced by SCREEN Semiconductor Solutions Co., Ltd.) was used to measure the thickness of the resist film in regions in which writing had been performed. A sensitivity curve was prepared that indicated a relationship between the common logarithm of the total extreme ultraviolet light irradiation dose and the remaining film fraction of the resist film after development (=thickness of resist film after development/thickness of resist film formed on silicon wafer).

Example 2

A positive resist composition was produced and various evaluations, etc., were performed in the same way as in Example 1 with the exception that a copolymer produced as described below was used. The results are shown in Table 1.

<Production of Copolymer>

A monomer composition containing 3.0 g of 2,2,3,3,3-pentafluoropropyl α-chloroacrylate (ACAPFP) as monomer (a), 3.476 g of α-methylstyrene (AMS) as monomer (b), 0.00551 g of azobisisobutyronitrile as a polymerization initiator, and 1.620 g of cyclopentanone as a solvent was loaded into a glass container. The glass container was tightly sealed and purged with nitrogen, and was then stirred for 6 hours in a 78° C. thermostatic tank under a nitrogen atmosphere. Thereafter, the glass container was restored to room temperature, the inside of the glass container was opened to the atmosphere, and then 10 g of tetrahydrofuran (THF) was added to the resultant solution. The solution to which the THF had been added was then dripped into 300 g of methanol to cause precipitation of a polymerized product. Thereafter, the solution containing the polymerized product that had precipitated was filtered using a Kiriyama funnel to obtain a white coagulated material (polymerized product). The obtained polymerized product had a weight-average molecular weight (Mw) of 46,772, a number-average molecular weight (Mn) of 29,853, and a molecular weight distribution (Mw/Mn) of 1.567. Moreover, the obtained polymerized product comprised 50 mol % of 2,2,3,3,3-pentafluoropropyl α-chloroacrylate units and 50 mol % of α-methylstyrene units.

[Purification of Polymerized Product]

Next, the obtained polymerized product was dissolved in 100 g of THF, and the resultant solution was dripped into a mixed solvent of 150 g of THF and 850 g of methanol (MeOH) to cause precipitation of a white coagulated material (copolymer comprising α-methyl styrene units and 2,2,3,3,3-pentafluoropropyl α-chloroacrylate units). Thereafter, the solution containing the copolymer that had precipitated was filtered using a Kiriyama funnel to obtain a white copolymer. The weight-average molecular weight, number-average molecular weight, and molecular weight distribution of the obtained copolymer were measured. The results are shown in Table 1.

Comparative Example 1

A positive resist composition was produced and various evaluations, etc., were performed in the same way as in Example 1 with the exception that a commercially available α-methylstyrene (AMS) methyl α-chloroacrylate (ACAM) copolymer (ZEP520A® (ZEP520A is a registered trademark in Japan, other countries, or both) produced by ZEON CORPORATION) was used as a copolymer, amyl acetate (ZED-N50 produced by ZEON CORPORATION) was used as a developer during development, and isopropyl alcohol was used as a rinsing liquid during rinsing. The results are shown in Table 1.

Comparative Example 2

A positive resist composition was produced and various evaluations, etc., were performed in the same way as in Example 1 with the exception that a copolymer produced as described below was used. The results are shown in Table 1.

<Production of Copolymer>

A monomer composition containing 3.0 g of 2,2,2-trifluoroethyl α-chloroacrylate (ACATFE) as monomer (a), 4.398 g of α-methylstyrene (AMS) as monomer (b), 0.00698 g of azobisisobutyronitrile as a polymerization initiator, and 1.851 g of cyclopentanone as a solvent was loaded into a glass container. The glass container was tightly sealed and purged with nitrogen, and was then stirred for 6 hours in a 78° C. thermostatic tank under a nitrogen atmosphere. Thereafter, the glass container was restored to room temperature, the inside of the glass container was opened to the atmosphere, and then 10 g of tetrahydrofuran (THF) was added to the resultant solution. The solution to which the THF had been added was then dripped into 300 g of methanol to cause precipitation of a polymerized product. Thereafter, the solution containing the polymerized product that had precipitated was filtered using a Kiriyama funnel to obtain a white coagulated material (polymerized product). The obtained polymerized product had a weight-average molecular weight (Mw) of 50,883, a number-average molecular weight (Mn) of 31,303, and a molecular weight distribution (Mw/Mn) of 1.625. Moreover, the obtained polymerized product comprised 50 mol % of 2,2,2-trifluoroethyl α-chloroacrylate units and 50 mol % of α-methylstyrene units.

[Purification of Polymerized Product]

Next, the obtained polymerized product was dissolved in 100 g of THF, and the resultant solution was dripped into a mixed solvent of 150 g of THF and 850 g of methanol (MeOH) to cause precipitation of a white coagulated material (copolymer comprising α-methyl styrene units and 2,2,2-trifluoroethyl α-chloroacrylate units). Thereafter, the solution containing the copolymer that had precipitated was filtered using a Kiriyama funnel to obtain a white copolymer. The weight-average molecular weight, number-average molecular weight, and molecular weight distribution of the obtained copolymer were measured. The results are shown in Table 1.

TABLE 1

| | | | Example 1 | Example 2 | Comparative Example 1 | Comparative Example 2 |
|---|---|---|---|---|---|---|
| Copolymer | Monomer (a) | Type | ACAPFP | ACAPFP | ACAM | ACATFE |
| | | Number of fluorine atoms [atoms] | 5 | 5 | 0 | 3 |
| | Monomer (b) | Type | 4FAMS | AMS | AMS | AMS |
| | | Number of fluorine atoms [atoms] | 1 | 0 | 0 | 0 |
| | | Total number of fluorine atoms [atoms] | 6 | 5 | 0 | 3 |
| | | Number-average molecular weight (Mn) [—] | 36477 | 36136 | 29409 | 46824 |
| | | Weight-average molecular weight (Mw) [—] | 47603 | 49486 | 54541 | 64383 |
| | | Molecular weight distribution (Mw/Mn) [—] | 1.305 | 1.369 | 1.855 | 1.375 |
| Resist film | | Density [g/cm³] | 1.49 | 1.40 | 1.17 | 1.27 |
| | | Sensitivity (Eth) [mJ/cm²] | 7.3 | 7.9 | 9.2 | 26.5 |

It can be seen from Table 1 that a resist pattern could be efficiently formed using extreme ultraviolet light in Examples 1 and 2 compared to Comparative Examples 1 and 2.

Reference Examples

Note that with the exception that an electron beam lithography tool (ELS-S50 produced by Elionix Inc.) was used instead of an EUV exposure tool (EQ-10M produced by Energetiq Technology, Inc.) and that the electron beam irradiation dose was varied in a range of 4 μC/cm² to 200 μC/cm² in increments of 4 μC/cm², a sensitivity curve that indicated a relationship between the common logarithm of the total electron beam irradiation dose and the remaining film fraction of the resist film after development (=thickness of resist film after development/thickness of resist film formed on silicon wafer) was prepared for resist films of Examples 1 and 2 and Comparative Examples 1 and 2, and the total electron beam irradiation dose Eth' (μC/cm²) was determined for when the remaining film fraction on a linear approximation of the gradient of the sensitivity curve was 0 in the same way as previously described. The values of Eth and Eth' for each of the resist films are shown in Table 2.

TABLE 2

| Resist film | Example 1 | Example 2 | Comparative Example 1 | Comparative Example 2 |
|---|---|---|---|---|
| Eth' [μC/cm²] | 65.7 | 69.7 | 56.0 | 186.0 |
| Eth [mJ/cm²] | 7.3 | 7.9 | 9.2 | 26.5 |
| Eth/Eth' [mJ/μC] | 0.11 | 0.11 | 0.16 | 0.14 |

It can be seen from Table 2 that the proportional improvement of sensitivity when the light source used in exposure is changed from an electron beam to extreme ultraviolet light is significantly larger for the resist films of Examples 1 and 2 compared to the resist films of Comparative Examples 1 and 2.

INDUSTRIAL APPLICABILITY

Through the presently disclosed positive resist composition for EUV lithography, it is possible to form a resist film having high sensitivity to extreme ultraviolet light.

Moreover, through the presently disclosed method of forming a resist pattern, it is possible to efficiently form a resist pattern using extreme ultraviolet light.

The invention claimed is:

1. A positive resist composition for EUV lithography comprising:

a copolymer including a monomer unit (A) represented by general formula (I), shown below,

where, in general formula (I), $R^1$ is an organic group including 5 or more fluorine atoms, and a monomer unit (B) represented by general formula (II), shown below,

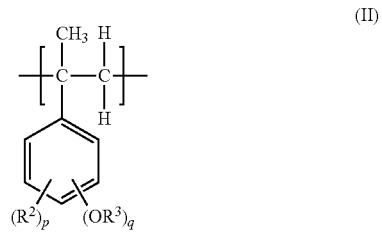

where, in general formula (II), $R^2$ is a hydrogen atom, a fluorine atom, an unsubstituted alkyl group, or a fluorine atom-substituted alkyl group, $R^3$ is a hydrogen atom, an unsubstituted alkyl group, or a fluorine atom-substituted alkyl group, p and q are each an integer of not less than 0 and not more than 5, and p+q=5; and a solvent, wherein
the monomer unit (B) includes 4-fluoro-α-methylstyrene unit.

2. The positive resist composition for EUV lithography according to claim 1, wherein $R^1$ is a fluoroalkyl group.

3. The positive resist composition for EUV lithography according to claim 1, wherein a total number of fluorine atoms included in the monomer unit (A) and the monomer unit (B) is 5 or 6.

4. A method of forming a resist pattern comprising:
forming a resist film using the positive resist composition for EUV lithography according to claim 1;
exposing the resist film using extreme ultraviolet light;
developing the resist film that has been exposed; and
rinsing the resist film that has been developed, wherein the rinsing is performed using a rinsing liquid having a surface tension of 20.0 mN/m or less.

5. The method of forming a resist pattern according to claim 4, wherein the rinsing liquid has a solubility parameter of less than 6.8 $(cal/cm^3)^{1/2}$.

6. The method of forming a resist pattern according to claim 4, wherein the developing is performed using a developer having a surface tension of 17.0 mN/m or less.

7. The method of forming a resist pattern according to claim 4, wherein the developer and the rinsing liquid each comprise a different fluorine-containing solvent relative to one another.

* * * * *